(12) United States Patent
Uda (10) Patent No.: US 6,232,159 B1
(45) Date of Patent: May 15, 2001

(54) METHOD FOR FABRICATING COMPOUND SEMICONDUCTOR DEVICE

(75) Inventor: Tomoya Uda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/357,828

(22) Filed: Jul. 21, 1999

(30) Foreign Application Priority Data

Jul. 22, 1998 (JP) .................................................. 10-206006

(51) Int. Cl.[7] .................................................. H01L 21/338
(52) U.S. Cl. .................................................. 438/172
(58) Field of Search .................................................. 438/172, 694, 438/167, 169, 180, 182, 572, 574, 576, 577, 578, 579

(56) References Cited

U.S. PATENT DOCUMENTS

| | | | |
|---|---|---|---|
| 4,742,026 | * 5/1988 | Vatus et al. | 437/245 |
| 5,110,751 | * 5/1992 | Nakagawa | 437/40 |
| 5,270,228 | * 12/1993 | Ishikawa | 437/39 |
| 5,654,214 | * 8/1997 | Frijlink et al. | 438/172 |
| 5,942,447 | * 8/1999 | Miyakuni | 438/740 |

FOREIGN PATENT DOCUMENTS

| | | |
|---|---|---|
| 0 841 691 A1 | 5/1998 | (EP) . |
| 1-133374 | 5/1989 | (JP) . |

* cited by examiner

Primary Examiner—David Nelms
Assistant Examiner—Quoc Hoang
(74) Attorney, Agent, or Firm—Eric J. Robinson; Nixon Peabody LLP (57) ABSTRACT

A method for fabricating a compound semiconductor device according to the present invention includes the steps of: a) depositing a first compound semiconductor layer over a substrate; b) depositing a second compound semiconductor layer on the first compound semiconductor layer, the second compound semiconductor layer being made of a compound with etch properties different from those of a compound for the first compound semiconductor layer; c) forming an etching mask on the second compound semiconductor layer, the etching mask having a first opening; d) anisotropically dry-etching the second compound semiconductor layer selectively with respect to the first compound semiconductor layer through the etching mask, thereby forming a second opening in the second compound semiconductor layer; and e) isotropically dry-etching the second compound semiconductor layer selectively with respect to the first compound semiconductor layer through the etching mask, thereby side-etching a side of the second opening and making the second opening greater in size than the first opening.

21 Claims, 6 Drawing Sheets

METHOD FOR FABRICATING COMPOUND SEMICONDUCTOR DEVICE

BACKGROUND OF THE INVENTION

The present invention generally relates to a method for fabricating a compound semiconductor device, and more particularly relates to a method for fabricating a field effect transistor (FET) for use in a compound semiconductor integrated circuit (IC) operating on microwave and millimeter wave bands.

In a conventional compound semiconductor device, such as an FET, a recessed structure is commonly used to improve the uniformity of a threshold voltage (hereinafter, referred to as "Vth") within a wafer plane and increase a breakdown voltage between gate and source and between gate and drain. In the recessed structure, part of an ohmic contact layer, which is located over a Schottky layer and in which a gate electrode should be formed (hereinafter, referred to as a "cap layers"), is selectively etched to have an opening larger in width than an etching mask.

Figure 6A:
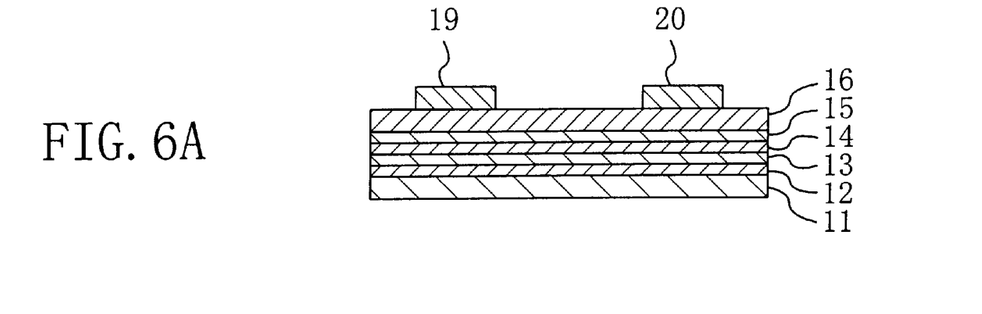
FIGS. 6A, 6B and 6C are cross-sectional views illustrating conventional process steps for fabricating an FET.
Figure 6B:
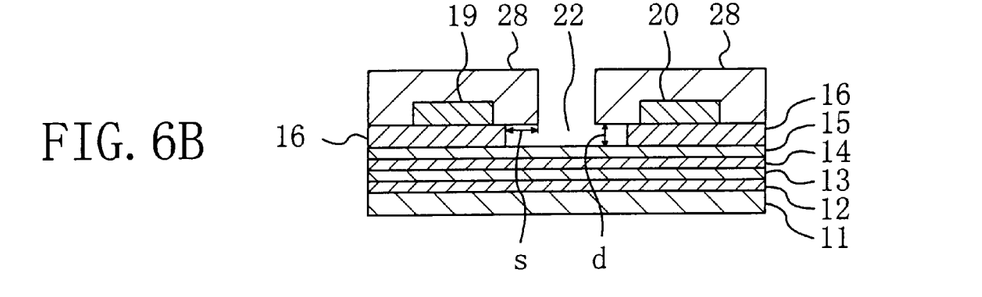
Figure 6C:
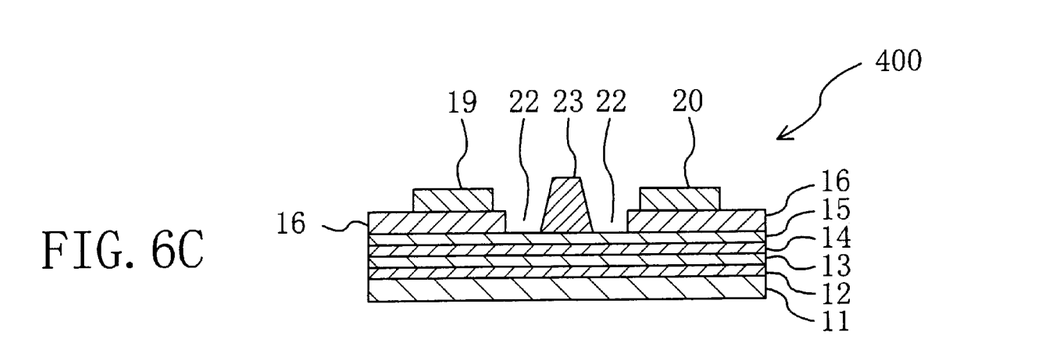

FIGS. 6A through 6C are cross-sectional views illustrating conventional process steps for fabricating a compound semiconductor FET 400 (hereinafter, simply referred to as a "compound FET" for the sake of simplicity). Although only one compound FET is shown in FIGS. 6A through 6C, typically a plurality of compound FETs 400 are fabricated in a single wafer.

First, as shown in FIG. 6A, an undoped GaAs buffer layer 12 (thickness: about 300 nm); an undoped InGaAs channel layer 13 (thickness: about 15 nm); an n-type AlGaAs electron supply layer 14 (thickness: about 10 nm) doped with Si at about $1\times10^{18}$ cm$^{-3}$; an undoped AlGaAs Schottky layer 15 (thickness: about 20 nm); and an n-type GaAs cap layer 16 (thickness: about 100 nm) doped with Si at about $3\times10^{18}$ cm$^{-3}$ are stacked in this order on a semi-insulating GaAs substrate 11. Then, source and drain electrodes 19 and 20 are formed to be spaced apart from each other on the cap layer 16 by stacking AuGe, Ni and Au layers (AuGe/Ni/Au) in this order thereon.

Next, as shown in FIG. 6B, a patterned resist film 28 is formed over the cap layer 16. Then, using this resist film 28 as an etching mask and a mixed gas of BCl$_3$ and SF$_6$, the cap layer 16 is dry-etched isotropically and selectively with respect to the Schottky layer 15, thereby forming a recessed portion 22 over the Schottky layer 15 to be larger in width than the opening of the resist film 28.

Next, an Al layer is deposited over the resist film 28. As shown in FIG. 6C, a gate electrode 23 made of the Al layer is formed on the bottom of the recessed portion 22 by a lift-off technique using the resist film 28.

According to this conventional method, only the cap layer 16 is selectively dry-etched isotropically using the mixed gas of BCl$_3$ and SF$_6$. Thus, the recessed portion 22 is formed to a uniform depth within the substrate (or wafer) 11, and therefore the threshold voltage Vth is highly uniform within the wafer plane. Also, since the recessed portion 22 is formed to be larger in width than the opening of the resist film 28, the gate electrode 23 is much less likely to come into contact with the cap layer 16. As a result, an FET with an increased breakdown voltage between gate and source or drain can be obtained.

According to this method, however, the distance between one edge of the opening of the resist film 28 and that of the recessed portion 22 (hereinafter, referred to as a "side-etch distance", which is identified by s in FIG. 6B) is equal to or larger than the thickness (which is identified by d in FIG. 6B) of the cap layer 16. This is because the recessed portion 22 is formed only by isotropic selective dry etching. Thus, the side-etch distance s cannot be smaller than the thickness d of the cap layer 16.

The gate-source and gate-drain breakdown voltages increase with the increase in side-etch distance. However, the gate-source and gate-drain resistance also increases correspondingly, and the transconductance decreases as a result. That is to say, a tradeoff is inevitable between gate breakdown voltage and transconductance in the performance of a semiconductor device of this type.

Accordingly, to regulate a gate breakdown voltage and transconductance depending on the required device performance and/or specific device structure, it is desirable to develop a method for forming a recessed structure, by which the side-etch distance can be controlled independently of the thickness of the cap layer 16.

SUMMARY OF THE INVENTION

An object of this invention is providing a method for fabricating a compound semiconductor device, in which a desired recessed structure can be formed by controlling the side-etch distance independently of the thickness of the layer to be etched.

A method for fabricating a compound semiconductor device according to the present invention includes the steps of: a) depositing a first compound semiconductor layer over a substrate; b) depositing a second compound semiconductor layer on the first compound semiconductor layer, the second compound semiconductor layer being made of a compound with etch properties different from those of a compound for the first compound semiconductor layer; c) forming an etching mask on the second compound semiconductor layer, the etching mask having a first opening; d) anisotropically dry-etching the second compound semiconductor layer selectively with respect to the first compound semiconductor layer through the etching mask, thereby forming a second opening in the second compound semiconductor layer; and e) isotropically dry-etching the second compound semiconductor layer selectively with respect to the first compound semiconductor layer through the etching mask, thereby side-etching a side of the second opening and making the second opening greater in size than the first opening.

In one embodiment of the present invention, a distance between the side of the second opening and an endpoint of the side etching is preferably smaller than the thickness of the second compound semiconductor layer in the step e).

In another embodiment of the present invention, the etching mask may be made of a resist material.

In still another embodiment, the method may further include the step of depositing an electrode layer on a part of the first compound semiconductor layer, which part is exposed inside the second opening, through the etching mask after the step e) has been performed.

In still another embodiment, the method may further include the step of forming another etching mask having a third opening on the etching mask formed on the second compound semiconductor layer, the third opening being greater in size than the first opening. In the step d), the second compound semiconductor layer is preferably anisotropically dry-etched selectively with respect to the first compound semiconductor layer through the etching mask and the another etching mask.

In still another embodiment, the etching mask is preferably made of either SiO$_2$ or SiN and the another etching mask is made of a resist material.

In still another embodiment, the method may further include, after the step e), the step of depositing an electrode layer on a part of the first compound semiconductor layer, which part is exposed inside the second opening, through the etching mask and the another etching mask.

In still another embodiment, the first compound semiconductor layer may be made of a compound semiconductor containing at least In or Al, and the second compound semiconductor layer may be made of a GaAs compound semiconductor.

In still another embodiment, the second compound semiconductor layer may be made of an InGaAs compound semiconductor, and the first compound semiconductor layer may be made of a compound semiconductor containing at least Al.

In still another embodiment, the step d) may be performed within a gaseous ambient containing molecules having Cl and molecules having F.

In still another embodiment, the step d) may be performed within an ambient containing $SiCl_4$ and $SF_6$ gases.

In still another embodiment, the step d) may be performed within a gaseous ambient containing molecules having at least one of N, O and C.

In still another embodiment, the step d) may be performed within an ambient containing $N_2$ gas.

In still another embodiment, a volume percentage of the $N_2$ gas in the ambient is preferably in the range from 13 vol % to 45 vol %.

In still another embodiment, the step e) may be performed within a gaseous ambient containing molecules having Cl and molecules having F.

In still another embodiment, the step e) may be performed within an ambient containing $SiCl_4$ and $SF_6$ gases.

In still another embodiment, a volume percentage of the $SF_6$ gas to a sum of the $SiCl_4$ and $SF_6$ gases ($SF_6/(SiCl_4+SF_6)$) may be in the range from 15 vol % to 35 vol %.

In still another embodiment, a volume percentage of the $SF_6$ gas to the sum of the $SiCl_4$ and $SF_6$ gases ($SF_6/(SiCl_4+SF_6)$) may be in the range from 23 volt to 30 vol %.

DESCRIPTION OF THE PREFERRED EMBODIMENTS

Embodiment 1

Hereinafter, a first exemplary embodiment of a method for forming a compound semiconductor device according to the present invention will be described with reference to FIGS. 5 1A through 1D. In the first embodiment, a method for fabricating a compound FET 100 shown in FIG. 1D will be described. Although only one compound FET is shown in FIG. 1D, typically a plurality of compound FETs 100 are fabricated in a single wafer.

The FET 100 includes: a semi-insulating GaAs substrate 11; a semiconductor layered structure formed on the substrate 11, the semiconductor layered structure including buffer layer 12/channel layer 13/electron supply layer 14/Schottky layer 15/cap layer 16 stacked in this order on a semi-insulating GaAs substrate 11; a gate electrode 23 formed on the Schottky layer 15 located within an opening 22 in the cap layer 16; and source and drain electrodes 19 and 20 formed on the cap layer 16 located on both sides of the gate electrode 23. The compound FET 100 has a recessed portion 22 with a uniform depth, and the distances between the gate electrode 23 and the portions of the cap layer 16 which function as source and drain are appropriately controlled, since the compound FET 100 is fabricated by the method according to the present invention. Accordingly, the compound FET 100 has a sufficiently high gate breakdown voltage and a desirable source-drain transconductance. Furthermore, the variation in Vth among the plurality of compound FETs 100, which are fabricated from a single wafer, is very small.

The method for fabricating the compound FET 100 will be described below with reference to FIGS. 1A through 1D.

Figure 1A:
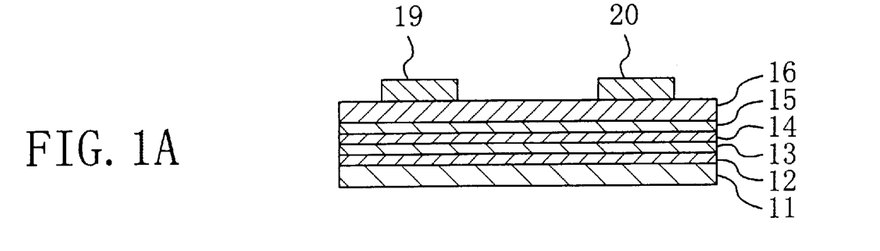
FIGS. 1A, 1B, 1C and 1D are cross-sectional views illustrating respective process steps for fabricating an FET according to a first embodiment of the present invention.

First, in the process step shown in FIG. 1A, an undoped GaAs buffer layer 12 (thickness: about 300 nm); an undoped InGaAs channel layer 13 (thickness: about 15 nm); an n-type AlGaAs electron supply layer 14 (thickness: about 10 nm) doped with Si at about $1\times10^{18}$ cm$^{-3}$; an undoped AlGaAs Schottky layer 15 (thickness: about 20 nm), which may be called a "first compound semiconductor layer"; and an n-type GaAs cap layer 16 (thickness: about 100 nm), which may be called a "second compound semiconductor layer" and has been doped with Si at about $3\times10^{18}$ cm$^{-3}$ are stacked in this order on a semi-insulating GaAs substrate 11. The multilayered semiconductor structure including these compound semiconductor layers 12, 13, 14, 15 and 16 may be formed by a known method such as epitaxial growth.

Then, source and drain electrodes 19 and 20 are formed to be spaced apart from each other on the cap layer 16 by stacking AuGe, Ni and Au layers in this order thereon. The source and drain electrodes 19 and 20 may be formed by evaporation and lift-off techniques.

Figure 1B:
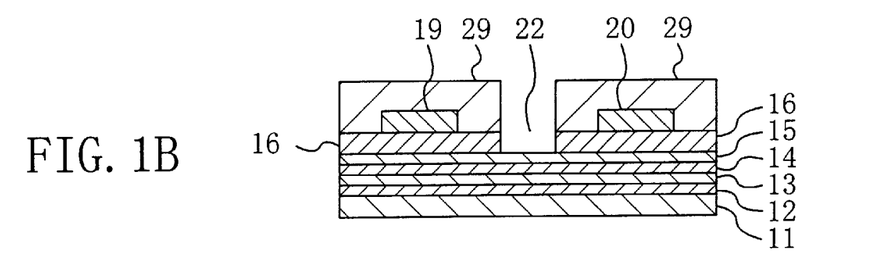

Next, in the process step shown in FIG. 1B, an etching mask 29 is formed over the cap layer 16. The etching mask 29 is preferably formed of a resist material (i.e., photosensitive resin). The resist material includes an organic resin as its main component, and therefore a sidewall protective film including organic compounds, which prevents the sidewall from being etched in the subsequent anisotropic etching process step, can be easily formed. Accordingly, the etching process step can be performed even more anisotropically.

Then, anisotropic etching is performed first to form the recessed structure. This process step may be called a "first etching process step".

The cap layer 16 is dry-etched anisotropically and selectively with respect to the Schottky layer 15, thereby forming a recessed portion (opening) 22 over the Schottky layer 15 to have the substantially same size (width) as the opening of the etching mask 29.

The cap layer 16 is formed of a material different from that of the Schottky layer 15 underlying the cap layer 16. Therefore, the Schottky layer 15 can function as an etch-stop layer in the dry-etching step. As long as the materials for the cap layer 16 and the Schottky layer 15 have mutually different etch rates in the dry-etching step, any materials may be used. For example, the respective layers 15 and 16 may be formed of compound semiconductor materials having different compositions. In other words, any materials may be used as long as such an etching gas as enabling selective etching of the cap layer 15 with respect to the Schottky layer 15 is available in the dry-etching step. The ratio of the etch rate of the cap layer 16 to that of the Schottky layer 15 (i.e., an etch selectivity) is preferably more than 100.

It is possible to obtain a sufficient selectivity if the Schottky layer 15 is made of a compound semiconductor containing at least In or Al and the cap layer 16 is made of a GaAs compound semiconductor. More particularly, the Schottky layer 15 is made of a compound semiconductor containing at least Al (e.g., an undoped InAlAs), and the cap layer 16 is made of an InGaAs compound semiconductor (e.g., n-type InGaAs). As the etching gas, it is preferable to use a gas containing molecules having Cl and molecules having F. A mixture containing $SiCl_4$ and $SF_6$ gases is more preferable. For example, if the mixture of $SiCl_4$ and $SF_6$ gases is used as the etching gas, then an etch selectivity of an n-type GaAs cap layer 16 doped with Si at about $3 \times 10^{18}$ $cm^{-3}$ with respect to an undoped AlGaAs Schottky layer 15 may be about 120. It is preferable that the volume percentage of the $SF_6$ gas to the sum of the $SiCl_4$ and $SF_6$ gases ($SF_6/(SiCl_4+SF_6)$) is preferably in the range from 15 vol % to 35 vol %. If the volume percentage of $SF_6$ gas is lower than 15 vol %, the etch selectivity may be undesirably low. If the volume percentage of the $SF_6$ gas exceeds 35 vol %, the etch rate may be undesirably low. More preferably, the $SF_6$ gas percentage is in the range from 23 vol % to 30 vol %, since the etch rate of the GaAs layer is substantially constant independent of the concentration of $SF_6$, in the etching ambient including the $SF_6$ gas within this rage of the concentration.

Furthermore, it is preferable that the etching ambient gas further contains molecules having at least one of N, O and C molecules (e.g., N, gas, O, gas, CF, gas, CHF, gas and the mixture thereof). The molecules including these elements are likely to form a sidewall protective film, which contributes to the suppression of side etching, thus advantageously improving the anisotropy of the etching. If $N_2$ is added to the etching ambient, the volume percentage of the $N_2$ gas in the ambient is preferably in the range from about 13 vol % to about 45 vol %. If the percentage of $N_2$ gas is lower than about 13 vol %, it may not be possible to sufficiently suppress the side-etching of the semiconductor layer. If the $N_2$ gas is added excessively at more than about 45 vol %, then the etching gas may be overly diluted and the etch rate of the cap layer 16 may adversely decrease. It is possible to further suppress the side-etching by using a resist material containing at least one of N, O and C to form the etching mask 29 and by adding a gas, which contains molecules having at least one of N, O and C, to the etching ambient.

Figure 2:
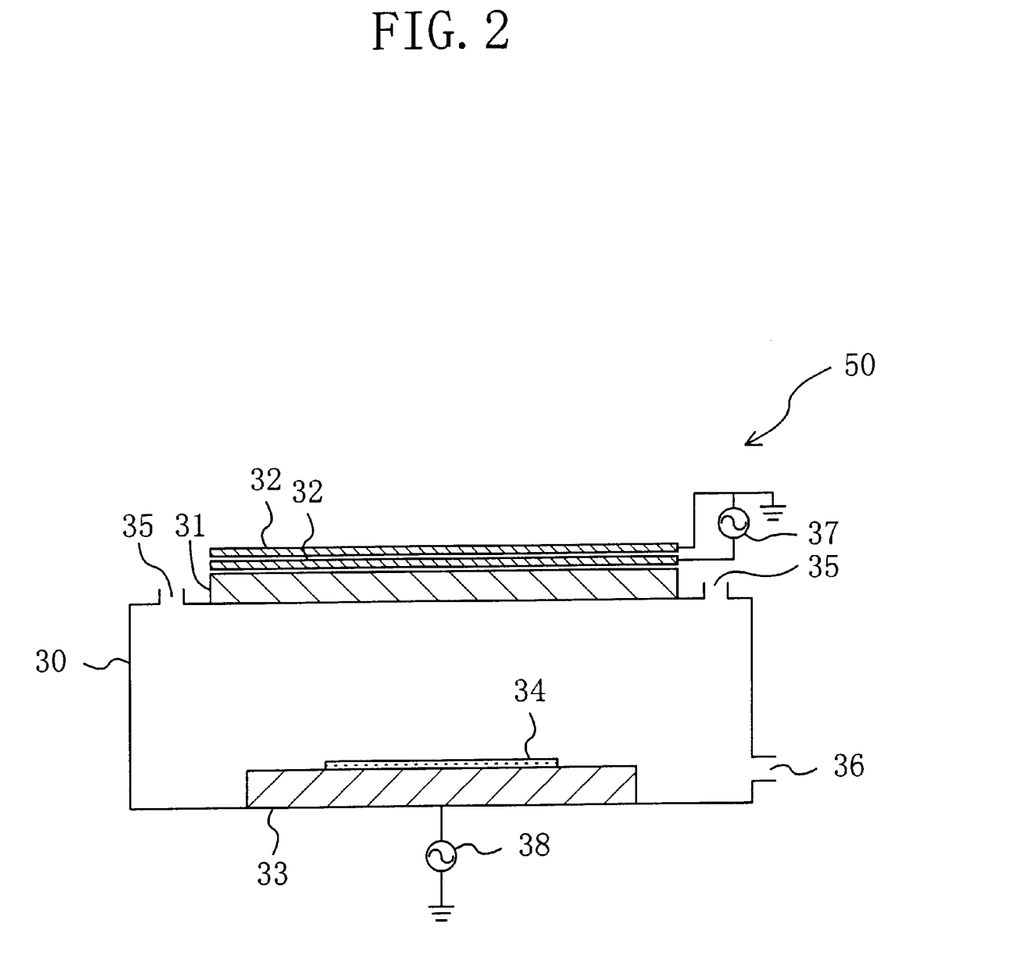
FIG. 2 is a cross-sectional view illustrating a structure of an inductively-coupled plasma etching system used in respective embodiments of the present invention.

As an etching system for conducting the anisotropic etching step, an inductively-coupled plasma (ICP) etching system 50 shown in FIG. 2 may be used, for example. Radio frequency power is applied from a plasma-inducing radio frequency power supply 37 to a plasma-inducing electrode 32, which is disposed over a reaction chamber 30 with a quartz glass plate 31 interposed therebetween, thereby generating plasma within the reaction chamber 30. Radio frequency power is also applied from a substrate-side radio frequency power supply 38 to a substrate-side electrode 33, on which a semiconductor substrate (i.e., an object to be etched) 34 is mounted. The pressure inside the reaction chamber 30 is controlled by supplying and exhausting a predetermined gas thereto/therefrom through etching gas inlet and outlet ports 35 and 36, respectively. In this manner, the ambient inside the reaction chamber 30 is controlled as described above. In addition, the radio frequency power is preferably applied to the plasma-inducing electrode 32 and substrate-side electrode 33 at a ratio ranging from 10:1 to 80:1. The reason is as follows. If the ratio is smaller than 10:1, then the radio frequency power applied from the substrate-side electrode 33 is relatively high, thus causing much damage to the semiconductor substrate 34 as a result of etching. On the other hand, if the ratio is larger than 80:1, then the radio frequency power applied from the substrate-side electrode 33 is relatively low, thus adversely decreasing the etch anisotropy. As the semiconductor substrate 34, a wafer is typically used.

Figure 1C:
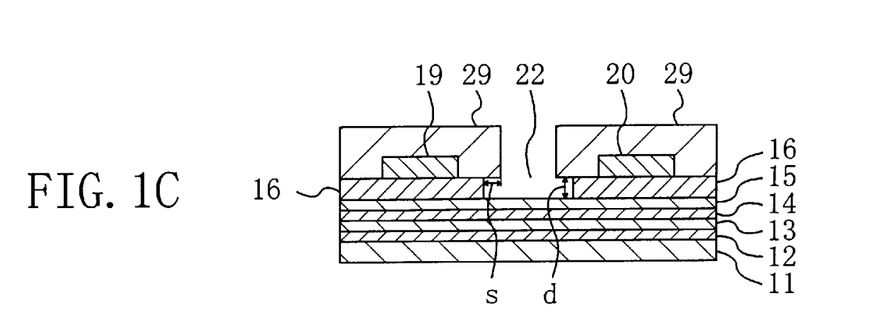
Figure 1D:
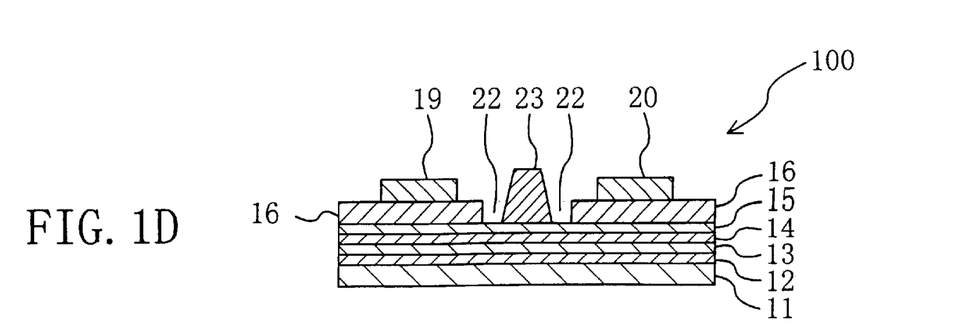

Then, in the process step shown in FIG. 1C, isotropic etching is conducted to widen the recessed portion 22. This step may be called a second etching process step.

The cap layer 16 is dry-etched isotropically and selectively with respect to the Schottky layer 15 using the etching mask 29, thereby widening the recessed portion 22 (by a side-etch distance s). This second etching process step can be conducted in the same reaction chamber 30 and back to back with the first etching process step. As the etching gas for the second etching process step, the same etching gas as that used for the first etching process step may be used to selectively etch the cap layer 16 with respect to the Schottky layer 15. However, it should be noted that the gas, which contains molecules having at least one of N, O and C and is added to the etching ambient to suppress side etching in the first etching step, is not added in this second etching step. Radio frequency power, which is applied in the first step to the substrate-side electrode 33 to improve the anisotropy, is not applied in the second etching process step. As described above, by dry-etching the cap layer 16 under such condition that the cap layer 16 is isotropically etched, the sidewall of the recessed portion 22 (cap layer 16) is selectively side-etched.

By employing a dry-etching method in the second etching step as described above, the variation in side-etch distance can be smaller within a wafer plane compared to employing a wet etching technique (e.g., with an etchant including a mixture of citric acid, $H_2O_2$, $NH_4OH$ and $H_2O$). Furthermore, if wet etching is performed in the second etching step, two different types of etching systems are required and, as a result, the two etching steps cannot be conducted continuously. In contrast, if dry etching is performed in the second etching step, the first and second etching process steps can be conducted continuously in a single etching system. As a result, the compound FET can be fabricated with a smaller number of process steps and more efficiently than the conventional method.

Subsequently, in the process step shown in FIG. 1D, a gate electrode 23 of Al is formed on the bottom of the recessed portion 22. For example, if the etching mask 29 is formed of a resist material, the gate electrode 23 can be easily formed by evaporating Al through the etching mask 29 and lifting off the etching mask 29.

In the method for fabricating an FET according to this embodiment, only the cap layer 16 is selectively dry-etched in the first etching process step of the recess forming process. Thus, the recessed portion 22 can be formed to a uniform depth within the substrate (or wafer) 11, and therefore the uniformity of the threshold voltage Vth within the wafer plane improves.

In addition, in the second etching step of the recess forming process, side etching is carried out as isotropic dry etching. Accordingly, the variation in etch rate within the wafer plane is small and the side-etch distance can be highly uniform within the wafer plane.

In the first etching process step of the recess forming process, the cap layer 16 is dry-etched anisotropically. Thus, in this process step, side etching does not proceed and the side-etch distance of the recessed portion 22 can be controlled only by the second etching process step. As a result, it is possible to control the side-etch distance independently of the thickness of the cap layer 16. Therefore, the present invention makes it possible to form a recessed portion 22 with a side-etch distance s smaller than the thickness d of the cap layer 16.

Thus, according to the method for fabricating an FET in this embodiment, an FET can be fabricated to have a highly uniform threshold voltage (i.e., smaller variation within a wafer plane) and desired gate breakdown voltage and transconductance by performing a smaller number of process steps. That is to say, the present invention makes it possible to more effectively fabricate a compound semiconductor device having a more desirable structure and showing a better performance than a conventional device.

In the following second and third embodiments, methods for fabricating other compound FETs with different structures will be described. The aforementioned explanation of the recess forming process in the first embodiment is also applicable to the following embodiments.

Embodiment 2

Hereinafter, a second exemplary embodiment of a method for forming a compound semiconductor device according to the present invention will be described with reference to FIG. 3A through 3E. In the second embodiment, a method for fabricating a compound FET 200 shown in FIG. 3E will be described.

The FET 200 includes a spacer layer 17 and an interlevel insulating layer 18 in addition to the FET 100 of the first embodiment. The spacer layer 17 functions as a spacer in the process step of forming source and drain electrodes 19, 20 by a lift-off technique. Since the compound FET 200 is also fabricated by the method according to the present invention, the compound FET 200 has a sufficient gate breakdown voltage and an appropriate transconductance. Furthermore, the variation in Vth among the plurality of compound FETs 200, which are fabricated from a single wafer, is very small.

The method for fabricating the compound FET 200 will be described below with reference to FIGS. 3A through 3E.

Figure 3A:
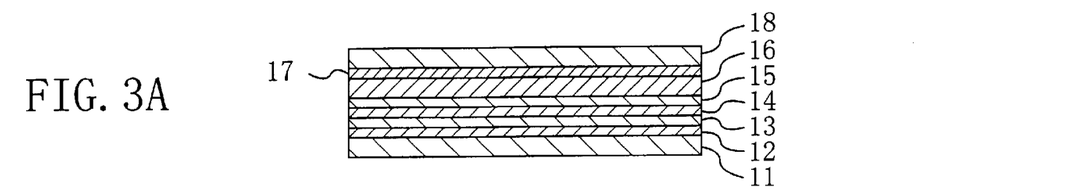
FIGS. 3A, 3B, 3C, 3D and 3E are cross-sectional views illustrating respective process steps for fabricating an FET according to a second embodiment of the present invention.

First, in the process step shown in FIG. 3A, an undoped GaAs buffer layer 12 (thickness: about 300 nm); an undoped InGaAs channel layer 13 (thickness: about 15 nm); an n-type AlGaAs electron supply layer 14 (thickness: about 10 nm) doped with Si at about $1\times10^{18}$ cm$^{-3}$; an undoped AlGaAs Schottky layer 15 (thickness: about 20 nm), which may be called a "first compound semiconductor layer"; and an n-type GaAs cap layer 16 (thickness: about 100 nm), which may be called a "second compound semiconductor layer" and has been doped with Si at about $3\times10^{18}$ cm$^{-3}$ are stacked in this order on a semi-insulating GaAs substrate 11. Then, an SiO$_2$ film 17, which is used as a spacer in the process step of forming source, drain and gate electrodes by a lift-off technique, is deposited on the cap layer 16 to a thickness of about 50 nm, and an SiN film 18, which is used as an interlevel insulating film, is deposited on the SiO$_2$ film 17 to a thickness of about 500 nm.

Figure 3B:
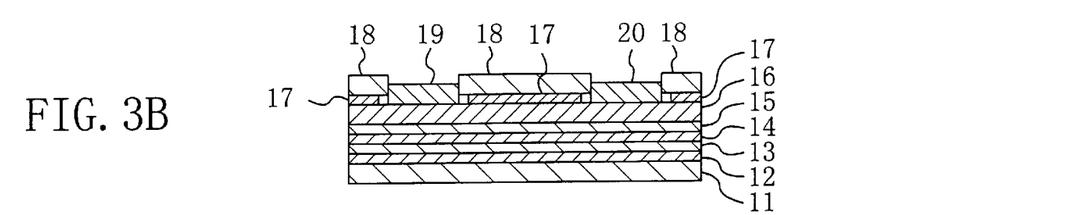

Next, in the process step shown in FIG. 3B, a first resist pattern (not shown) with a plurality of openings spaced apart from each other is formed, and openings are formed within the SiN film 18 by anisotropic dry etching, specifically, reactive ion etching (RIE) using CF$_4$ gas. Thereafter, openings are formed at corresponding locations within the SiO$_2$ film 17 by wet etching using hydrofluoric acid. And then source and drain electrodes 19 and 20 are formed within these openings by stacking AuGe, Ni and Au layers on the cap layer 16 in this order by evaporation and lift-off techniques.

Figure 3C:
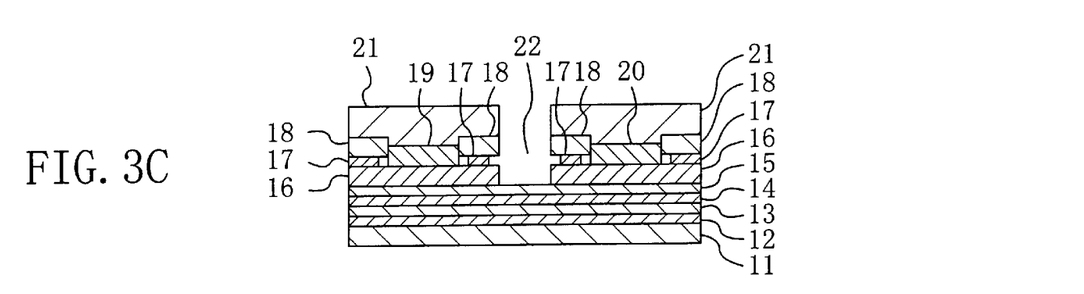

Next, in the process step shown in FIG. 3C, a second resist pattern 21 is defined, and an opening is formed within the SiN film 18 by anisotropic dry etching, specifically, RIE using CF$_4$ gas and the second resist pattern 21 as an etching mask. Then, an opening is formed at a corresponding location within the SiO$_2$ film 17 by wet etching using hydrofluoric acid.

Thereafter, a first etching process step for forming a recessed structure is performed. Specifically, the cap layer 16 is dry-etched anisotropically and selectively with respect to the Schottky layer 15 using the second resist pattern 21 as an etching mask, thereby forming a recessed portion 22 over the Schottky layer 15 to have the same width as the opening of the second resist pattern 21. In this process step, a mixed gas of SiCl$_4$ and SF$_6$ is used as an etching gas and N$_2$ is also introduced as an additive gas. This first etching process is performed using an inductively-coupled plasma (ICP) etching system used in the first etching process step. Radio frequency power is applied to a plasma inducing electrode 32, which is disposed over a reaction chamber 30 with a quartz glass plate 31 interposed therebetween, thereby generating plasma within the reaction chamber 32. Radio frequency power is also applied to a substrate-side electrode 33, on which a semiconductor substrate (e.g., wafer) 34 is mounted.

Figure 3D:
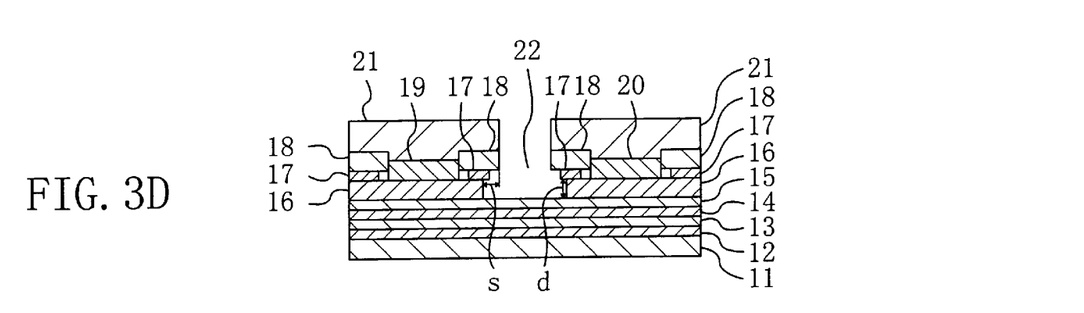
Figure 3E:
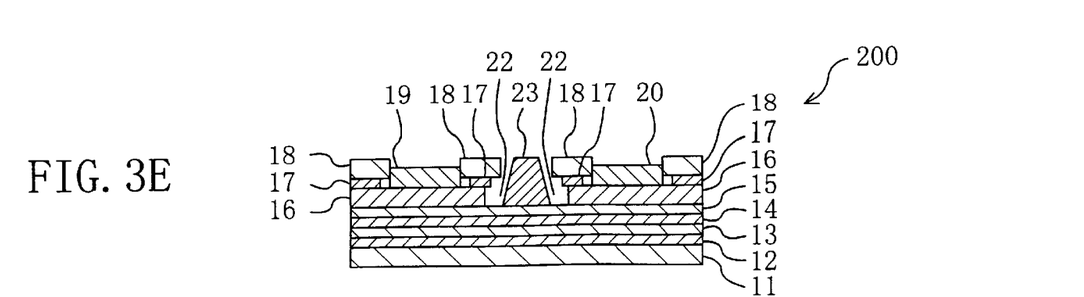

Then, a second etching process step for forming a recessed structure is performed as shown in FIG. 3D. Specifically, using the same ICP etching system and the same etching mask (i.e., the second resist pattern 21) as those used in the first step, the cap layer 16 is dry-etched isotropically and selectively with respect to the Schottky layer 15 with a mixed gas of SiCl$_4$ and SF$_6$ supplied as an etching gas, thereby widening the recessed portion 22. In this process step, however, no radio frequency power is applied to the substrate-side electrode 33, on which the semiconductor substrate 34 is mounted.

Finally, in the process step shown in FIG. 3E, a gate electrode 23 of Al is formed on the bottom of the recessed portion 22 by evaporation and lift-off processes using the second resist pattern 21.

Figure 4:
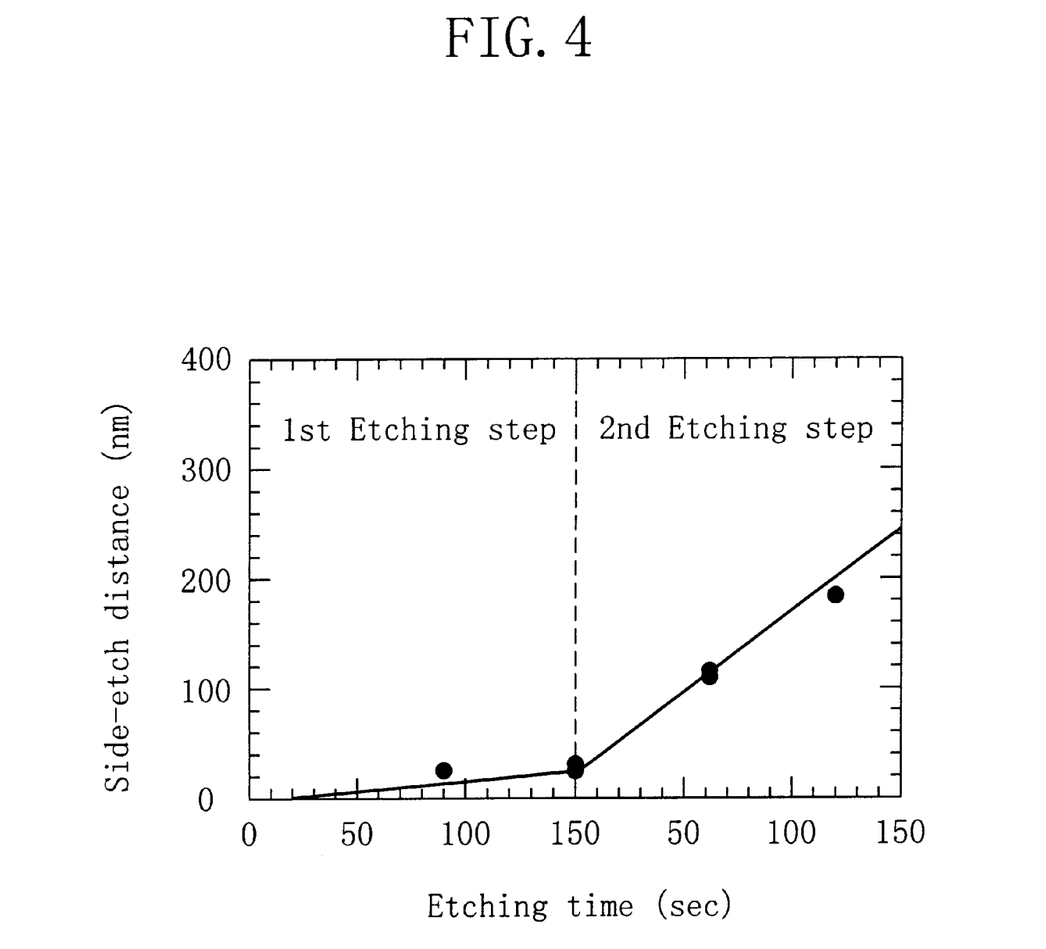
FIG. 4 is a graph illustrating the dependence of a side-etch distance on etch time in the first and second etching process steps according to respective embodiments of the present invention.

FIG. 4 illustrates how the side-etch distance of the cap layer 16 changes with etch time in the first and second etching process steps. The side-etch distance s was measured by analyzing the cross section of the etched semiconductor wafer using a scanning electron microscope (SEM). As shown in FIG. 4, side etching hardly proceeds in the first step with the etch time. It can also be seen from FIG. 4 that no dead time (i.e., a time lag just after the start of an etching process, during which actual etching does not proceed) exists at the beginning of the second etching process step. That is to say, soon after the first step is switched into the second step, side etching starts instantaneously, and the side-etch distance increases proportionally to the etch time.

In the method for fabricating an FET according to this embodiment, a mixed gas of SiCl$_4$ and SF$_6$ is used as an etching gas in the first etching process step. Thus, only the cap layer 16 can be selectively etched by taking advantage of the difference in etch rate between GaAs and AlGaAs.

Thus, the recessed portion 22 can be formed to a uniform depth within the substrate (or wafer) 11, and therefore the uniformity of the threshold voltage Vth within the wafer plane improves.

In addition, etch anisotropy is improved in the first etching process step because of the following reasons. Firstly, a resist is used as an etching mask and $N_2$ is introduced as an additive gas. Thus, a sidewall protective film, containing the organic component of the resist and nitrogen component of the additive gas, is formed on the sidewall of the etched portion. Secondly, in this process step, radio frequency power is applied to the substrate-side electrode 33 for mounting the semiconductor substrate 34 thereon in the ICP etching system. Accordingly, a negative voltage is applied to the semiconductor substrate 34 and the directions of ions bombarded onto the semiconductor substrate 34 can be aligned more satisfactorily. Thus, even if the cap layer 16 is excessively etched, side etching of the cap layer 16 hardly proceeds and the side-etch distance of the recessed portion 22 can be controlled only by the second etching process step. That is to say, it is possible to control the side-etch distance independently of the thickness of the cap layer 16.

In the second etching process step, side etching is carried out as isotropic dry etching. Accordingly, the variation in etch rate within the wafer plane is small and the side-etch distance can be highly uniform within the wafer plane.

Moreover, since there is no dead time at the beginning of the second etching process step, the side-etch distance can be controlled based on the etch time of the second step alone. Thus, the width of the recessed portion 22 is arbitrarily controllable.

Furthermore, in the second etching process step, the ICP etching system is used and no radio frequency power is applied to the substrate-side electrode 33. Thus, almost no negative electric field is formed in the semiconductor substrate 34. Accordingly, compared to a conventional RIE process, the energy of ions bombarded onto the semiconductor substrate 34 is lower, and therefore damage resulting from the ion bombardment can be reduced.

In addition, since the first and second etching process steps are both dry etching, these steps can be continuously performed using the same etching system. That is to say, the number of process steps does not increase.

Moreover, in the first and second etching process steps, the same mixed gas of $SiCl_4$ and $SF_6$ is used as an etching gas. Accordingly, even if the same reaction chamber is used for etching throughout these process steps, there is no need to change the ambient within the chamber. That is to say, since the etching gas is not changed, there is no need to evacuate the chamber and produce a high vacuum at that time, either. As a result, the processing time can be shortened.

Thus, according to the method for fabricating an FET in this embodiment, an FET can be fabricated to have a highly uniform threshold voltage within a wafer plane and desired gate breakdown voltage and transconductance by performing a smaller number of process steps.

Embodiment 3

Hereinafter, a third exemplary embodiment of a method for forming a compound semiconductor device according to the present invention will be described with reference to FIG. 5A through 5F. In the third embodiment, a method for fabricating a compound FET 300 with a recessed structure shown in FIG. 5F will be described.

The FET 300 includes an insulating layer 26 on the cap layer 16, which defines a gate electrode 23 (a gate opening 25), a source electrode 19 and a drain electrode 20, in addition to the FET 100 of the first embodiment. The gate electrode 23 is a T-gate electrode with a gate length of 0.3 μm or less.

Since the compound FET 300 is also fabricated by the method according to the present invention, the compound FET 300 has a sufficient gate breakdown voltage and an appropriate transconductance. Furthermore, the variation in Vth among the plurality of compound FET 300, which are fabricated from a single wafer, is very small.

The method for fabricating the compound FET 300 will be described below with reference to FIGS. 5A through 5F.

Figure 5A:
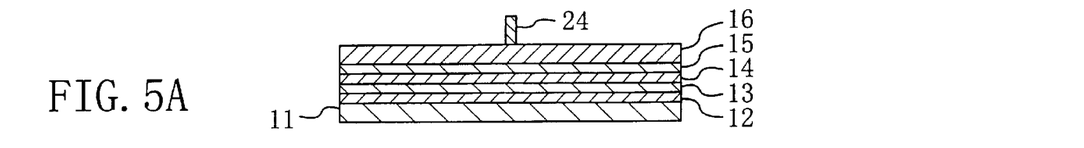
FIGS. 5A, 5B, 5C, 5D, 5E and 5F are cross-sectional views illustrating respective process steps for fabricating an FET according to a third embodiment of the present invention.

First, in the process step shown in FIG. 5A, an undoped GaAs buffer layer 12 (thickness: about 300 nm); an undoped InGaAs channel layer 13 (thickness: about 15 nm); an n-type AlGaAs electron supply layer 14 (thickness: about 10 nm) doped with Si at about $1 \times 10^{18}$ cm$^{-3}$; an undoped AlGaAs Schottky layer 15 (thickness: about 20 nm), which may be called a "first compound semiconductor layer"; and an n-type GaAs cap layer 16 (thickness: about 100 nm), which may be called a "second compound semiconductor layer" and has been doped with Si at about $3 \times 10^{18}$ cm$^{-3}$ are stacked in this order on a semi-insulating GaAs substrate 11. Then, a dummy gate resist pattern 24 is formed on the cap layer 16 with a pattern size of about 0.2 μm by photolithography using a positive resist and a phase shift mask.

Figure 5B:
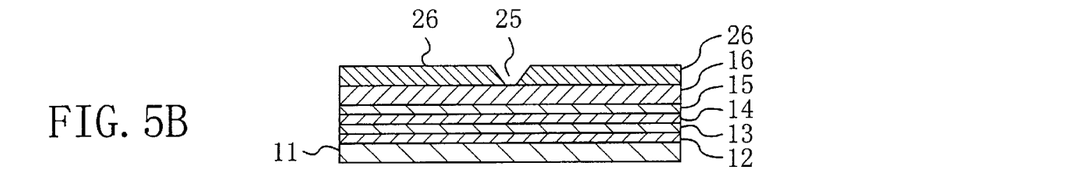

Next, in the process step shown in FIG. 5B, an $SiO_2$ film 26 is formed by evaporation and lift-off processes on the cap layer 16 to a thickness of about 200 nm so as to have a gate opening 25 with a width of about 0.2 μm.

Figure 5C:
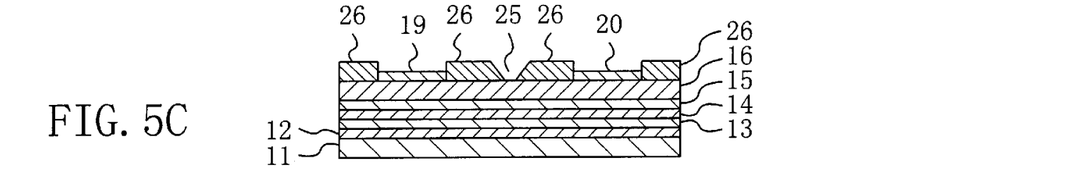

Subsequently, in the process step shown in FIG. 5C, a second resist pattern (not shown) with a plurality of openings spaced apart from each other is formed on the $SiO_2$ film 26. Then, openings are formed within the $SiO_2$ film 26 by wet etching using hydrofluoric acid and the second resist pattern as an etching mask. Thereafter, source and drain electrodes 19 and 20 are formed within these openings by stacking AuGe, Ni and Au layers in this order on the cap layer 16 by evaporation and lift-off techniques.

Figure 5D:
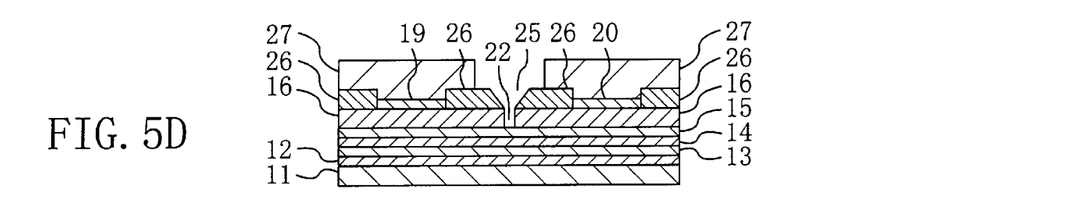

Next, in the process step shown in FIG. 5D, a third resist pattern 27 with an opening greater in width than the gate opening 25 of the $SiO_2$ film 26 is formed over the $SiO_2$ film 26. Then, the first etching process step is performed as in the second embodiment. Specifically, the cap layer 16 is dry-etched anisotropically and selectively with respect to the Schottky layer 15 using the $SiO_2$ film 26 and third resist pattern 27 as an etching mask, thereby forming a recessed portion 22 over the Schottky layer 15 with the same width as the opening of the $SiO_2$ film 26. In this process step, a mixed gas of $SiCl_4$ and $SF_6$ is used as an etching gas and $N_2$ is also introduced as an additive gas. As in the second embodiment, this etching process is performed using the ICP etching system shown in FIG. 2. Radio frequency power is applied to the plasma-inducing electrode 32, thereby generating plasma within the reaction chamber 30. Radio frequency power is also applied to the substrate-side electrode 33, on which the semiconductor substrate 34 is mounted.

Figure 5E:
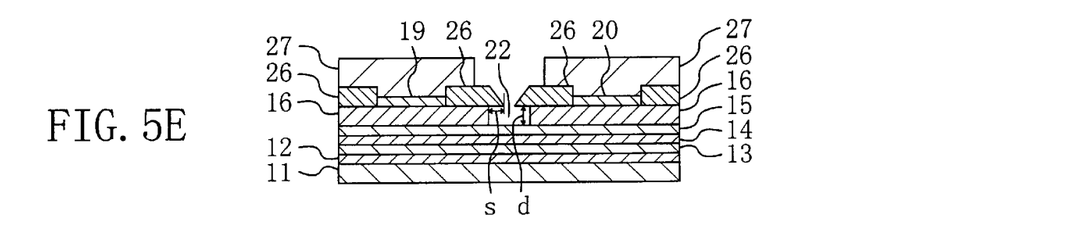
Figure 5F:
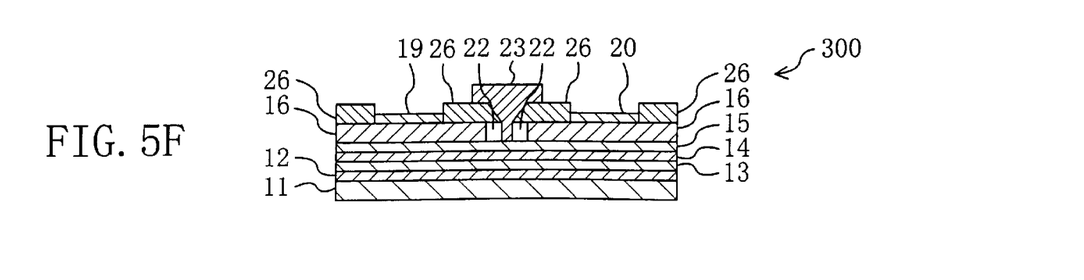

Then, as shown in FIG. 5E, a second etching process step is performed as in the second embodiment. Specifically, using the same ICP etching system, etching mask (i.e., the $SiO_2$ film 26 and the third resist pattern 27) and etching gas (i.e., the mixed gas of $SiCl_4$ and $SF_6$) as those used in the first step, the cap layer 16 is dry-etched isotropically and selectively with respect to the Schottky layer 15, thereby widening the recessed portion 22. In this process step, no radio frequency power is applied to the substrate-side electrode 33, on which the semiconductor substrate 34 is mounted.

Finally, in the process step shown in FIG. 5F, a gate electrode 23 of Al is formed on the bottom of the recessed portion 22 by evaporation and lift-off processes using the third resist pattern 27.

The side-etch distance of the cap layer 16, which was measured in the first and second etching process steps of the third embodiment, also changed with etch time as illustrated in FIG. 4 for the second embodiment.

According to the method for fabricating an FET in the third embodiment, the same effects as those attained by the second embodiment are also attainable.

In the third embodiment, the gate electrode 23 is formed by a lift-off technique using the $SiO_2$ film 26 with the gate opening 25 of about 0.2 $\mu$m and the third resist pattern 27 with an opening greater in width than the gate opening 25. Thus, a fine-line T-gate electrode with a gate length of 0.3 $\mu$m or less can be formed.

Consequently, according to the method for fabricating an FET in this embodiment, even if a fine-line T-gate electrode should be formed with a gate length of 0.39 $\mu$m or less, an FET can be fabricated to have a highly uniform threshold voltage within a wafer plane and desired gate breakdown voltage and transconductance by performing a smaller number of process steps.

In the recess etching process steps according to the third embodiment, it may not be preferable to form the T-gate electrode 23 in the following manner. First, the cap layer 16 may be etched anisotropically by using only the $SiO_2$ film 26 with the gate opening 25 as an etching mask without forming the third resist pattern 27. After the second etching process step, the third resist pattern 27 with an opening greater in width than the gate opening 25 of the $SiO_2$ film 26 may be formed over the $SiO_2$ film 26. And then the gate electrode 23 of Al may be formed on the recessed portion 22 by evaporation and lift-off techniques. According to this alternate method, however, since no resist exists over the cap layer 16 during the anisotropic dry etching thereof, the sidewall of the etched portion thereof cannot be protected sufficiently. Thus, the cap layer 16 cannot be etched with good anisotropy. That is to say, if the cap layer 16 is excessively etched, then the cap layer 16 is side-etched unintentionally and it is impossible to accurately control the side-etch distance.

In the foregoing embodiments of the present invention, methods for fabricating compound FETs have been described. However, the present invention is not limited thereto, but is also applicable to fabricating other compound semiconductor devices, such as heterojunction bipolar transistor (HBT) and laser diode. Furthermore, the present invention is applicable to fabricating an SiGe compound semiconductor transistor.

As described above, the present invention provides a method for fabricating a compound semiconductor device, by which a desired recessed structure can be formed with the side-etch distance controlled independently of the thickness of the layer to be etched. In the method for fabricating a compound semiconductor according to the present invention, anisotropic selective dry etching is performed first, and then isotropic selective dry etching is performed. Accordingly, a recessed structure can be formed by performing a relatively simple process with good controllability of the side-etch distance. Therefore, according to the method of the present invention, an FET showing a highly uniform threshold voltage within a wafer plane and desired gate breakdown voltage and transconductance can be fabricated.

The method according to the present invention is suitably applicable to the fabrication of an FET as a high-power amplifier, which is used in the transmitter section of a mobile communications unit and should have a high gate breakdown voltage, or a low-noise amplifier, which is used in the receiver section of a mobile communications unit and should have a high transconductance.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for fabricating a compound semiconductor device, comprising the steps of:
   a) depositing a first compound semiconductor layer over a substrate;
   b) depositing a second compound semiconductor layer on the first compound semiconductor layer, the second compound semiconductor layer being made of a compound with etch properties different from those of a compound for the first compound semiconductor layer;
   c) forming an etching mask on the second compound semiconductor layer, the etching mask having a first opening;
   d) anisotropically dry-etching the second compound semiconductor layer selectively with respect to the first compound semiconductor layer through the etching mask, thereby forming a second opening in the second compound semiconductor layer; and
   e) isotropically dry-etching the second compound semiconductor layer selectively with respect to the first compound semiconductor layer through the etching mask, thereby side-etching a side of the second opening and making the second opening greater in size than the first opening, wherein the steps d) and e) are performed by using an etching system which includes a reaction chamber and a substrate-side electrode provided in the reaction chamber,
   wherein in the steps d) and e), the substrate is mounted on the substrate-side electrode,
   wherein in the step d), radio frequency power is applied to the substrate-side electrode, and
   wherein in the step e), radio frequency power is not applied to the substrate-side electrode.

2. The method of claim 1, wherein in the step e), a distance between the side of the second opening and an endpoint of the side etching is smaller than the thickness of the second compound semiconductor layer.

3. The method of claim 1, wherein the etching mask is made of a resist material.

4. The method of claim 1, further comprising the step of depositing an electrode layer on a part of the first compound semiconductor layer, which part is exposed inside the second opening, through the etching mask after the step e) has been performed.

5. The method of claim 1, further comprising the step of forming another etching mask having a third opening on the etching mask formed on the second compound semiconductor layer, the third opening being greater in size than the first opening,
   wherein, in the step d), the second compound semiconductor layer is anisotropically dry-etched selectively with respect to the first compound semiconductor layer through the etching mask and the another etching mask.

6. The method of claim 5, wherein in the step e), a distance between the side of the second opening and an endpoint of the side etching is smaller than the thickness of the second compound semiconductor layer.

7. The method of claim 5, wherein the etching mask is made of either $SiO_2$ or SiN and the another etching mask is made of a resist material.

8. The method of claim 5, further comprising, after the step e), the step of depositing an electrode layer on a part of the first compound semiconductor layer, which part is exposed inside the second opening, through the etching mask and the another etching mask.

9. The method of claim 1, wherein the first compound semiconductor layer is made of a compound semiconductor containing at least In or Al, and the second compound semiconductor layer is made of a GaAs compound semiconductor.

10. The method of claim 1, wherein the second compound semiconductor layer is made of an InGaAs compound semiconductor, and the first compound semiconductor layer is made of a compound semiconductor containing at least Al.

11. The method of claim 1, wherein the step d) is performed within a gaseous ambient containing molecules having Cl and molecules having F.

12. The method of claim 11, wherein the step d) is performed within an ambient containing $SiCl_4$ and $SF_6$ gases.

13. The method of claim 1, wherein the step d) is performed within a gaseous ambient containing molecules having at least one of N, O and C.

14. The method of claim 13, wherein the step d) is performed within an ambient containing $N_2$ gas.

15. The method of claim 14, wherein a volume percentage of the $N_2$ gas in the ambient is in the range from 13 vol % to 45 vol %.

16. The method of claim 1, wherein the step e) is performed within a gaseous ambient containing molecules having Cl and molecules having F.

17. The method of claim 16, wherein the step e) is performed within an ambient containing $SiCl_4$ and $SF_6$ gases.

18. The method of claim 12, wherein a volume percentage of the $SF_6$ gas to a sum of the $SiCl_4$ and $SF_6$ gases ($SF_6/(SiCl_4+SF_6)$) is in the range from 15 vol % to 35 vol %.

19. The method of claim 18, wherein a volume percentage of the $SF_6$ gas to the sum of the $SiCl_4$ and $SF_6$ gases ($SF_6/(SiCl_4+SF_6)$) is in the range from 23 vol % to 30 vol %.

20. The method of claim 17, wherein a volume percentage of the $SF_6$ gas to a sum of the $SiCl_4$ and $SF_6$ gases ($SF_6/(SiCl_4+SF_6)$) is in the range from 15 vol % to 35 vol %.

21. The method of claim 20, wherein a volume percentage of the $SF_6$ gas to the sum of the $SiCl_4$ and $SF_6$ gases ($SF_6/(SiCl_4+SF_6)$) is in the range from 23 vol % to 30 vol %.

* * * * *